United States Patent
You et al.

(10) Patent No.: US 7,668,279 B1
(45) Date of Patent: Feb. 23, 2010

(54) SIGNAL PROCESSING SYSTEM WITH LOW BANDWIDTH PHASE-LOCKED LOOP

(75) Inventors: Zhong You, Austin, TX (US); Hua Hong, Austin, TX (US); Jeff Baumgartner, Austin, TX (US); Jieren Bian, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 538 days.

(21) Appl. No.: 11/427,910

(22) Filed: Jun. 30, 2006

(51) Int. Cl.
*H03D 3/24* (2006.01)

(52) U.S. Cl. ...................................... 375/376
(58) Field of Classification Search ................. 375/376, 375/327, 294, 371, 373; 327/147, 156, 157, 327/554; 331/17
See application file for complete search history.

(56) References Cited

U.S. PATENT DOCUMENTS

| | | | |
|---|---|---|---|
| 6,208,216 B1 * | 3/2001 | Nasila | 332/110 |
| 6,690,240 B2 | 2/2004 | Maxim et al. | 331/17 |
| 7,002,418 B2 * | 2/2006 | Zhu et al. | 331/17 |
| 2005/0248395 A1 * | 11/2005 | Zhu et al. | 327/554 |
| 2008/0129353 A1 * | 6/2008 | Lin | 327/157 |

* cited by examiner

*Primary Examiner*—Khai Tran
(74) *Attorney, Agent, or Firm*—Hamilton & Terrile, LLP; Kent B. Chambers

(57) ABSTRACT

A signal processing system includes a phase-locked loop to provide an output signal used, for example, as a delta sigma modulator operating clock signal. In at least one embodiment, a frame clock that provides synchronization for one or more blocks of data is used by the phase-locked loop as a reference signal. Utilizing the frame clock as the reference signal allows the signal processing system to reduce the number of clock signals present in the signal processing system. In another embodiment, a phase-locked loop includes a loop filter that utilizes a sample and reset circuit, a feed forward integrator, and a feed forward stabilizer to provide a low frequency phase-locked loop bandwidth. In at least one embodiment, the feed forward integrator amplifies capacitance of the sample and reset circuit, which reduces the size of loop filter capacitors and, thus, allows on-chip capacitor integration.

21 Claims, 10 Drawing Sheets

SIGNAL PROCESSING SYSTEM WITH LOW BANDWIDTH PHASE-LOCKED LOOP

BACKGROUND OF THE INVENTION

1. Field of the Invention

The present invention relates in general to the field of information processing, and more specifically to a signal processing system and method for generating a clock signal using a low-bandwidth phase-locked loop.

2. Description of the Related Art

Phase-locked loops are widely used in integrated circuits to provide an output signal in a predetermined phase relationship with a reference signal. The phase-locked loop output signal is a multiple of the reference signal. FIG. 1 depicts a classical phase-locked loop 100. The phase detector 102 compares a reference signal Ref having a frequency $f_{ref}$ with a phase-locked loop feedback signal FB having a frequency $f_{VCO}/N$ and generates a phase error signal E, where N is a positive real number. Thus, the phase-locked loop 100 increases the frequency $f_{ref}$ of reference signal Ref by a factor of N and maintains phase-alignment with the reference signal Ref. The value of the phase error signal represents a difference between phases of the reference signal Ref and the feedback signal FB. The reference signal Ref typically originates from a signal source that produces a periodic signal such as a crystal or ring oscillator. The loop filter 104 acts as a low-pass filter to smooth the phase error signal.

Voltage controlled oscillator (VCO) 106 generates a periodic phase-locked loop output signal PLLOUT having a frequency $f_{VCO}=f_{ref}\times N$. The filtered phase error signal E is an oscillator control signal OCS that regulates the frequency of the phase-locked loop output signal PLLOUT. The VCO 106 responds to the phase error signal E by increasing or decreasing the frequency of phase-locked loop output signal PLLOUT to match $f_{ref}\times N$. The phase-locked loop output signal PLLOUT feeds back through frequency divider 108 to generate the feedback signal FB. Thus, the phase-locked loop 100 provides the output signal PLLOUT that is intended to have a predefined phase relationship (such as phase alignment) with the reference signal Ref and is a multiple of reference signal Ref. Some embodiments of phase-locked loop 100 substitute a current controlled oscillator (ICO) for the VCO 106. The phase-locked loop 100 operates essentially in the same manner except that the loop filter 104 includes a transconductance amplifier to provide a current based control signal to control the phase-locked loop output signal PLLOUT of the VCO 106.

FIG. 2 depicts an illustrative digital-to-analog signal processing system 200 having a delta sigma modulator 202 that converts oversampled input signal DATA into a series of M-bit output signals, where M is an integer greater than or equal to one (1). In at least one embodiment, the average of the series of M-bit represents the input signal DATA. The digital-to-analog converter (DAC) 204 converts the digital output of delta sigma modulator 202 into an analog signal output signal y(t). The signal processing system 200 is particularly useful for audio applications. For audio applications, the bandwidth of interest for the input signal DATA is generally in the 0 Hz to 25 kHz region. The analog signal generated by DAC 204 can be used for many purposes, such as to drive audio speakers.

The delta sigma modulator 202 and DAC 204 are clocked by the phase-locked loop output signal PLLOUT of phase-locked loop 206. In at least one embodiment, phase-locked loop 206 operates in the same manner as phase-locked loop 100. Serial clock SCLK represents the reference signal used by phase-locked loop 206.

FIG. 3 depicts clock signal timing diagrams 300 of two clock signals typically present in an audio digital-to-analog signal processing system. Clock signal LRCK represents a 'left-right' clock and is also often referred to as a "frame clock". The frame clock signal LRCK identifies sample rates and frames two channels of data that exist in a single data stream. Historically, the equally spaced pulses of frame clock signal LRCK have a fifty percent (50%) duty cycle with the peaks and valleys being assigned to respective left and right channels (or vice versa). Thus, in a two channel system, data received during a peak is assigned to the left audio channel, and data received during a valley is assigned to the right audio channel. The use of the frame clock signal LRCK can be expanded for use in other multi-channel systems by assigning multiple channels to each peak and valley of frame clock signal LRCK.

The serial clock SCLK, also referred to as a "bit clock", is used to clock the shifting of data into or out of a serial data port. The frequency of the serial clock SCLK is directly proportional to a data sampling rate and data word length. The minimum serial clock SCLK frequency is twice the sampling rate times the number of bits in each data word.

The third clock signal (not shown) is a master clock. The master clock is used to derive the frame clock signal LRCK and, thus, has a fixed, proportional relationship to the frame clock signal LRCK.

Referring to FIGS. 2 and 3, the loop bandwidth of the phase-locked loop 200 sets the low-pass cutoff frequency of the VCO control signal. As the loop bandwidth of phase-locked loop 200 narrows, the phase-locked loop 200 becomes slower in responding to phase changes in the reference signal Ref and maintaining a lock on the reference signal Ref becomes more difficult.

The serial clock SCLK has a higher frequency relative to the frame clock signal LRCK. Thus, phase-locked loop 206 has a wide loop bandwidth to track the relatively high frequency serial clock SCLK. A wide bandwidth phase-locked loop 206 is desirable from an integrated circuit standpoint because capacitors in loop filter 104 are relatively small can often be implemented as part of the integrated circuit, i.e. 'on-chip'.

However, the serial clock SCLK is not a particularly stable reference source relative to the master clock and the frame clock signal LRCK. Instability, such as jitter (i.e. phase changes) and frequency shifts, in the reference signal causes the phase-locked loop output signal PLLOUT to also reflect the instabilities of serial clock SCLK.

FIG. 4 depicts an illustrative digital-to-analog signal processing system 400 (DAC system 400) that uses a master clock MCLK as a reference signal for the wide bandwidth phase-locked loop 402. In at least one embodiment, phase-locked loop 402 operates in the same manner as phase-locked loop 100. The DAC system 400 includes delta sigma modulator 202 followed by a pulse-width modulation encoder 404 to convert the serial output of the delta sigma modulator 202 into a representation of the input signal DATA. DAC system 400 also includes a low-pass, digital finite infinite response (FIR) filter 406 typically having 64-taps or less to attenuate energy in out-of-band frequencies. The DAC 408 converts the digital output of the FIR filter 406 into an analog output signal y(t).

A crystal oscillator generates the master clock master clock MCLK. The master clock MCLK is typically more stable and has a higher frequency than the serial clock SCLK and provides a reliable reference signal to phase-locked loop 402. However, the DAC system 400 still uses the serial clock SCLK, the DATA signal, and the frame clock signal LRCK to convert the digital DATA signal into an analog signal. The addition of the master clock MCLK, while addressing the stability issues of the serial clock SCLK, adds an extra level of complexity, electromagnetic issues, and cost to an integrated circuit.

FIG. 5 depicts a Type III RC loop filter 500 which represents an exemplary loop filter of a phase-locked loop such as phase-locked loop 100. In general, the loop filter design can govern the response of a phase-locked loop. The phase error signal E from the phase detector controls the conductivity of switches 502 and 504. A charge pump 501 includes switches 502 and 504 to respectively source or sink current to the RC circuit 506. Switches 502 and 504 can be respective complimentary metal oxide semiconductor (CMOS) p-channel and n-channel transistors. If the phase error signal E indicates a phase increase (UP) is needed for the phase-locked loop output signal PLLOUT to match the phase of the phase-locked loop reference signal, switch 502 conducts to source charge to the RC circuit 506 while switch 504 is nonconductive ("off"). Otherwise, to decrease the phase of phase-locked loop output signal PLLOUT, switch 504 conducts to sink charge from RC circuit 506 while switch 502 is off. In one embodiment, the phase error signal E is split into non-overlapping signals E and $\overline{E}$ (i.e. the inverse of E) to respectively control the conductivity of switches 502 and 504

Equation [1] represents an open-loop, S-domain transfer function for loop filter 500:

$$H(s)_{open} = \frac{Icp \times Kvco \times (1 + RC_1 s)}{2\pi \times N \times s^2 (RC_1 C_2 s + C_1 + C_2)}, \quad [1]$$

where Icp is the charge pump source/sink current, Kvco is the VCO gain constant, R is a resistor value, C1 and C2 are capacitor values, N is the frequency division constant, and s is a Laplace complex variable.

From equation [1], for low frequency loop bandwidth operation, e.g. below approximately 5,000 Hz, the implementation and performance of RC loop filter 506 can exhibit several drawbacks. For example, the loop filter 500 produces an undesirable ripple in control signal oscillator control signal OCS at low frequencies, such as 48 kHz or less, and high divide ratios, such as 1024:1. Additionally, to achieve low bandwidth operation, capacitors values C1 and C2 will be too large to be implemented on-chip. In at least one embodiment, for an audio application, low bandwidth is at or below 20 kHz. For example, for Icp=10 µA, Kvco=40 MHz/V, and a loop bandwidth of 5 kHz, C1=1.2 nF, which is too large to practically integrate on-chip.

FIG. 6 depicts a dual charge pump, loop filter 600, which represents an exemplary loop filter of a phase-locked loop such as phase-locked loop 100. Embodiments of the components and operation of loop filter 600 are described in U.S. Pat. No. 6,690,240. The loop filter 600 includes a feed forward, reset path 602 to provide loop stabilization and includes an integration path 604. The transfer function of loop filter 600 is based on an average charge from charge pumps 606 and 608. Accordingly, the oscillator control signal OCS is a step function with minimal ripple. However, from the natural frequency equation [2], the phase-locked loop bandwidth is determined primarily from capacitor 614. So, as the corner bandwidth frequency decreases, the value Cint of capacitor 614 increases. For low frequencies, e.g. lower than 5 kHz, capacitor 614 is too large to be integrated on-chip and is, thus, implemented as a discrete component.

Additionally, the reset path 602 has two paths 610 and 612. The two paths 610 and 612 hold the input voltage of gm2 and separate switching noise from charge pump 606 from the ICO 616. However, any mismatch between capacitor Cprop1 and Cprop2 causes an undesirable tone at the switching frequency/2 in the phase-locked loop output signal PLLOUT.

$$\omega_n = \sqrt{\frac{Kico \times Icp \times gm1}{2\pi \times Cint \times N}}, \quad \text{Equation [2]}$$

$\omega_n$ is the natural frequency of loop filter 600, Icp is the charge pump 606 source/sink current, Kico is the ICO gain constant, Cint represents the value of integrating capacitor 614, N is the frequency division constant, and gm1 is a transconductance amplifier.

SUMMARY OF THE INVENTION

In one embodiment of the present invention, a signal processing system includes a phase-locked loop having a reference signal input to receive a reference signal. The reference signal is a frame clock signal having a frequency FS. The frame clock signal provides synchronization for one or more blocks of data. The phase-locked loop includes components to multiply the reference signal by N to generate a phase-locked loop output signal having a nominal frequency of FS×N, and N is a number greater than one (1). The signal processing system also includes a delta sigma modulator having an operating clock input coupled to the phase-locked loop to receive the phase-locked loop output signal. The signal processing system further includes a signal converter coupled to an output of the delta sigma modulator.

In another embodiment of the present invention, a method of processing a signal includes phase locking an output signal to a reference signal. The reference signal is a frame clock signal having a frequency FS. The frame clock signal provides synchronization for one or more blocks of data, and the phase-locked loop includes components to multiply the reference signal by N to generate a phase-locked loop output signal having a nominal frequency of FS×N. N is a number greater than one (1). The method also includes providing the output signal to an operating clock signal input terminal of a delta sigma modulator.

In a further embodiment of the present invention, a phase-locked loop includes a phase detector and a loop filter coupled to the phase detector. The loop filter includes a current source coupled between the phase detector and the sample and reset circuit. During operation, the current source is responsive to a phase detection output signal of the phase detector. The loop filter also includes a feed forward integrator, a feed forward stabilizer, and a sample and reset circuit coupled between (i) the current source and (ii) the feed forward integrator and the feed forward stabilizer. The phase-locked loop also includes an oscillator coupled to the feed forward integrator and the feed forward stabilizer. During operation, the oscillator includes a periodic output signal responsive to output signals of the feed forward integrator and the feed forward stabilizer.

In another embodiment of the present invention, a method of phase-locking an output signal to a reference signal includes detecting a phase difference between the output signal and the reference signal. The method also includes generating a phase correction signal and sampling and resetting the phase correction signal. The method further includes integrating and stabilizing the sampled phase correction signal using parallel, respective feed forward integration and stabilizing components, generating an oscillator control signal from the feed forward integration and stabilizing components, and generating a periodic output signal responsive to the oscillator control signal.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A signal processing system includes a phase-locked loop to provide an output signal used, for example, as a delta sigma modulator operating clock signal. In at least one embodiment, a frame clock that provides synchronization for one or more blocks of data is used by the phase-locked loop as a reference signal. Utilizing the frame clock as the reference signal allows the signal processing system to reduce the number of clock signals present in the signal processing system. In another embodiment, a phase-locked loop includes a loop filter that utilizes a sample and reset circuit, a feed forward integrator, and a feed forward stabilizer to provide a low frequency phase-locked loop bandwidth. In at least one embodiment, the feed forward integrator amplifies capacitance of the sample and reset circuit, which reduces the size of loop filter capacitors and, thus, allows on-chip capacitor integration.

Figure 7:
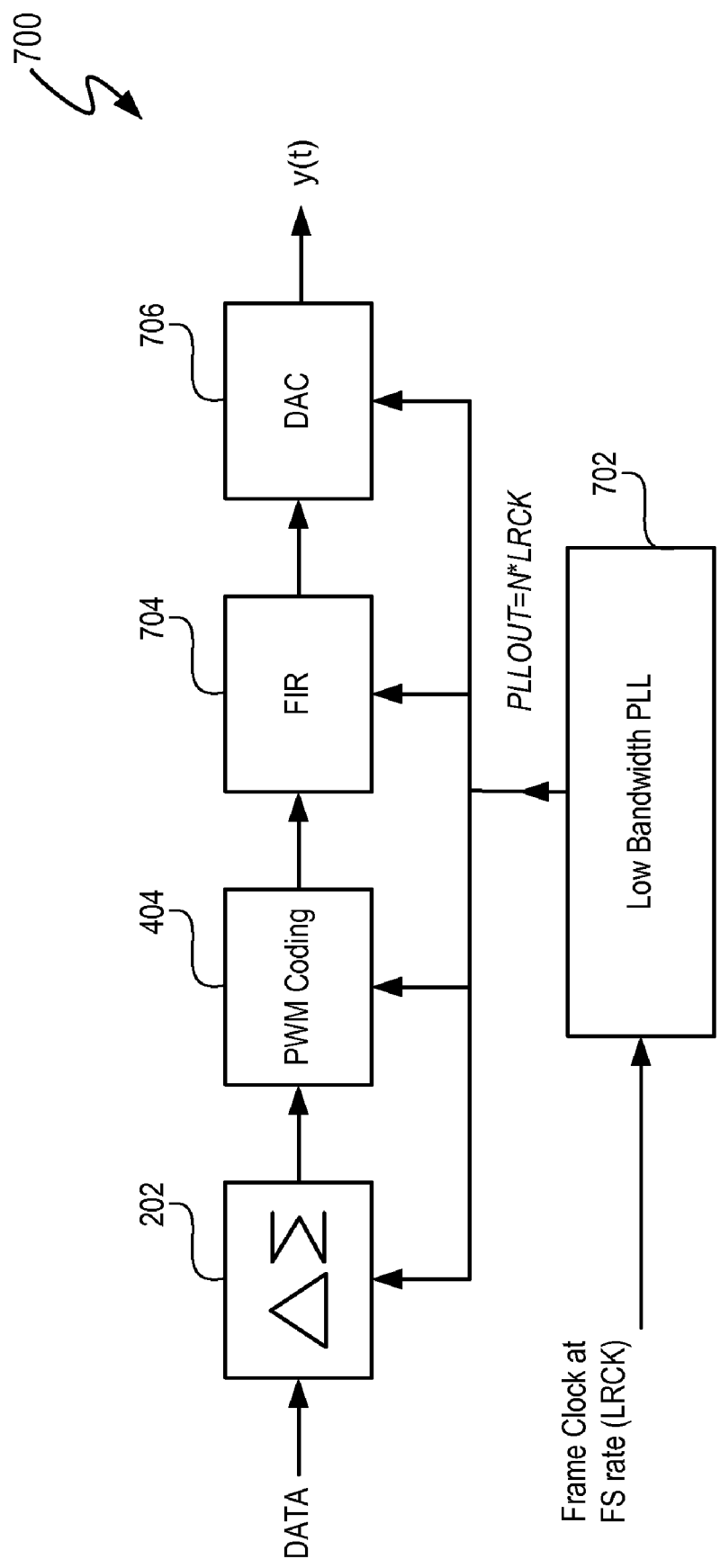
FIG. 7 depicts a digital-to-analog signal processing system.

FIG. 7 depicts an illustrative digital-to-analog signal processing system 700 (DAC system 700) that uses the frame clock signal LRCK as a reference signal for the low bandwidth phase-locked loop 702. In at least one embodiment, the phase-locked loop 702 has the general topology of phase-locked loop 100.

The frame clock signal LRCK can provide a stable reference signal for phase-locked loop 702. In at least one embodiment, the frame clock signal LRCK frequency matches the sample rate of the input signal DATA provided to delta sigma modulator 202. The phase-locked loop multiplies the frame clock signal LRCK by a factor of N to generate phase-locked loop output signal PLLOUT. In one embodiment, N is 1,024. The phase-locked loop output signal PLLOUT accommodates the higher clock rate used by delta sigma modulator 202 for oversampling and used by low-pass FIR filter 704 to provide real time processing of the input signal DATA.

Utilizing the frame clock signal LRCK as the reference signal to the phase-locked loop 702 can eliminate the master clock MCLK. Although system 700 can utilize the master clock MCLK for other purposes, eliminating the master clock MCLK from DAC system 700 can eliminate the higher frequencies associated with the master clock MCLK, reduce component counts, and free or eliminate physical space otherwise occupied by the master clock MCLK generator and signal paths. In at least one embodiment, for audio applications, a higher frequency of master clock MCLK is 12 MHz.

The DAC system 700 includes delta sigma modulator 202 followed by a pulse-width modulation ("PWM") encoder 404 to convert the serial output of the delta sigma modulator 202 into a representation of the input signal DATA. DAC system 700 also includes a low-pass, digital finite infinite response (FIR) filter 704 typically having at least 128 taps to attenuate energy in out-of-band frequencies. In an audio system, the out-of-band frequencies are, for example, frequencies above the standard human audio range, i.e. approximately 25 kHz. The DAC 706 converts the digital output of the FIR filter 704 into an analog output signal y(t). The analog output signal y(t) can be used for example, to provide audio data to speakers and/or an amplifier.

Figure 8:
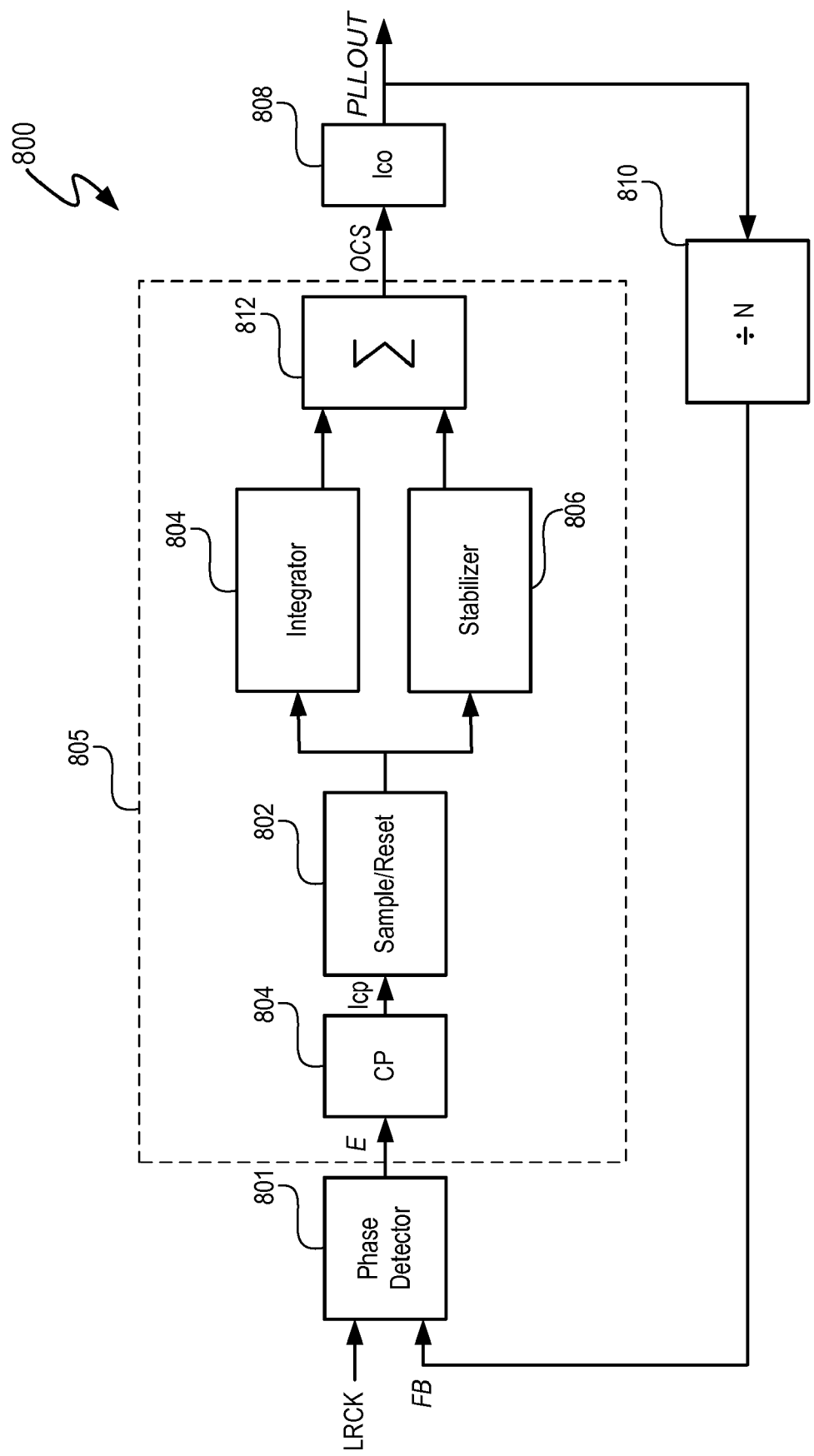
FIG. 8 depicts an exemplary low-bandwidth phase-locked loop.

FIG. 8 depicts an exemplary low-bandwidth phase-locked loop 800, which represents one embodiment of low bandwidth phase-locked loop 702. In at least one embodiment, the phase detector 801 functions in the same manner as phase detector 102. The reference signal for phase detector 801 is, for example, the frame clock signal frame clock signal LRCK. Other reference signals can also be used. The phase detector 801 compares the frame clock reference signal LRCK with a phase-locked loop feedback signal FB. Conventionally, signal processing systems such as DAC system 700 do not use the frame clock signal LRCK as a reference signal because an integrated, low bandwidth phase-locked loop conventionally uses an off-chip capacitor, which adds expense to DAC system 700. In at least one embodiment, the loop filter 805 allows the phase-locked loop 800 to achieve a low bandwidth response using all on-chip capacitors by amplifying capacitance in the loop filter 805. As explained in more detail below, amplifying the capacitance of the loop filter 800 allows loop filter to be implemented with smaller capacitors that can be integrated on-chip.

Loop filter 805 includes a single charge pump (CP) 804 that is responsive to the phase error signal E. The charge pump 804 provides an output signal Icp to sample and reset circuit 802 that causes the frequency phase-locked loop output signal PLLOUT to match the reference frequency frame clock signal LRCK times a multiplier N in a feedback path (not shown) of phase-locked loop 702. The particular values of frame clock signal LRCK and N are matters of design choice and, for example, depend upon the application of phase-locked loop 702. The sample and reset circuit 802 preferably has no memory and, therefore, does not add an extra pole to loop filter 805. The sample and reset circuit 802 samples the charge pump output signal Icp at the same frequency as the frame clock signal LRCK. The sampled output signal is filtered by two parallel feed forward paths, the feed forward integrator 804 and the feed forward stabilizer 806. The stabilizer 806 provides a stabilizing pole in the open loop transfer function of the phase-locked loop 702. Loop filter 805 sends the output signals of integrator 804 and stabilizer 806 through respective transconductance amplifiers (not shown) and sums the output of the transconductance amplifiers at summer 812 to generate an oscillator control signal OCS.

ICO 808 responds to the oscillator control signal OCS to generate the phase-locked loop output signal PLLOUT. The phase-locked loop output signal PLLOUT has a nominal frequency equal to the frame clock reference signal LRCK. The term "nominal" is used to indicate that phase-locked loop 800 adjusts output signal PLLOUT to maintain a predetermined frequency relationship to the frame clock reference signal LRCK. In at least one embodiment, the predetermined frequency relationship is determined by frequency divider 810. Frequency divider 810 divides the phase-locked loop output signal PLLOUT by a factor of N to generate a phase-locked loop feedback signal FB having a frequency of FS, where the frequency of phase-locked loop output signal PLLOUT is $f_{ico}$ and the frequency of phase-locked loop feedback signal FB is $f_{ico}/N$. "N" is, for example, the difference between the oversampling, operating frequency of delta sigma modulator 202 and the frequency of frame clock signal LRCK, such as 1,024.

Figure 9:
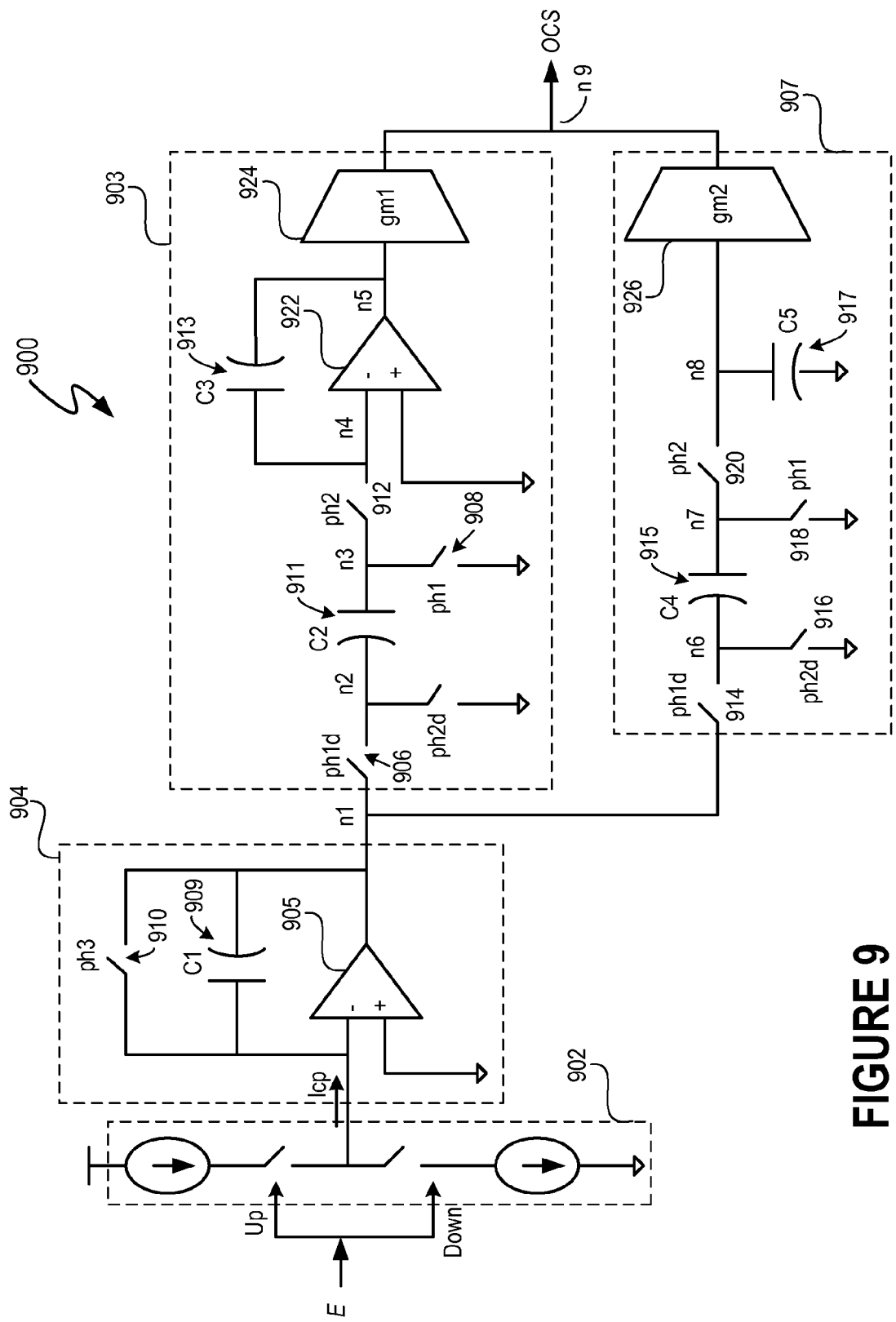
FIG. 9 depicts a loop filter for a phase-locked loop.

FIG. 9 depicts a low bandwidth loop filter 900 with integrated ("on-chip") capacitors. Loop filter 900 represents one embodiment of loop filter 805. The low bandwidth loop filter 900 operates in accordance with timing diagram 1000 of FIG. 10. The timing signals in timing diagram 1000 accurately portray relative transitions but are not necessarily to scale. The exact timing of each timing signal is a matter of design choice.

Figure 10:
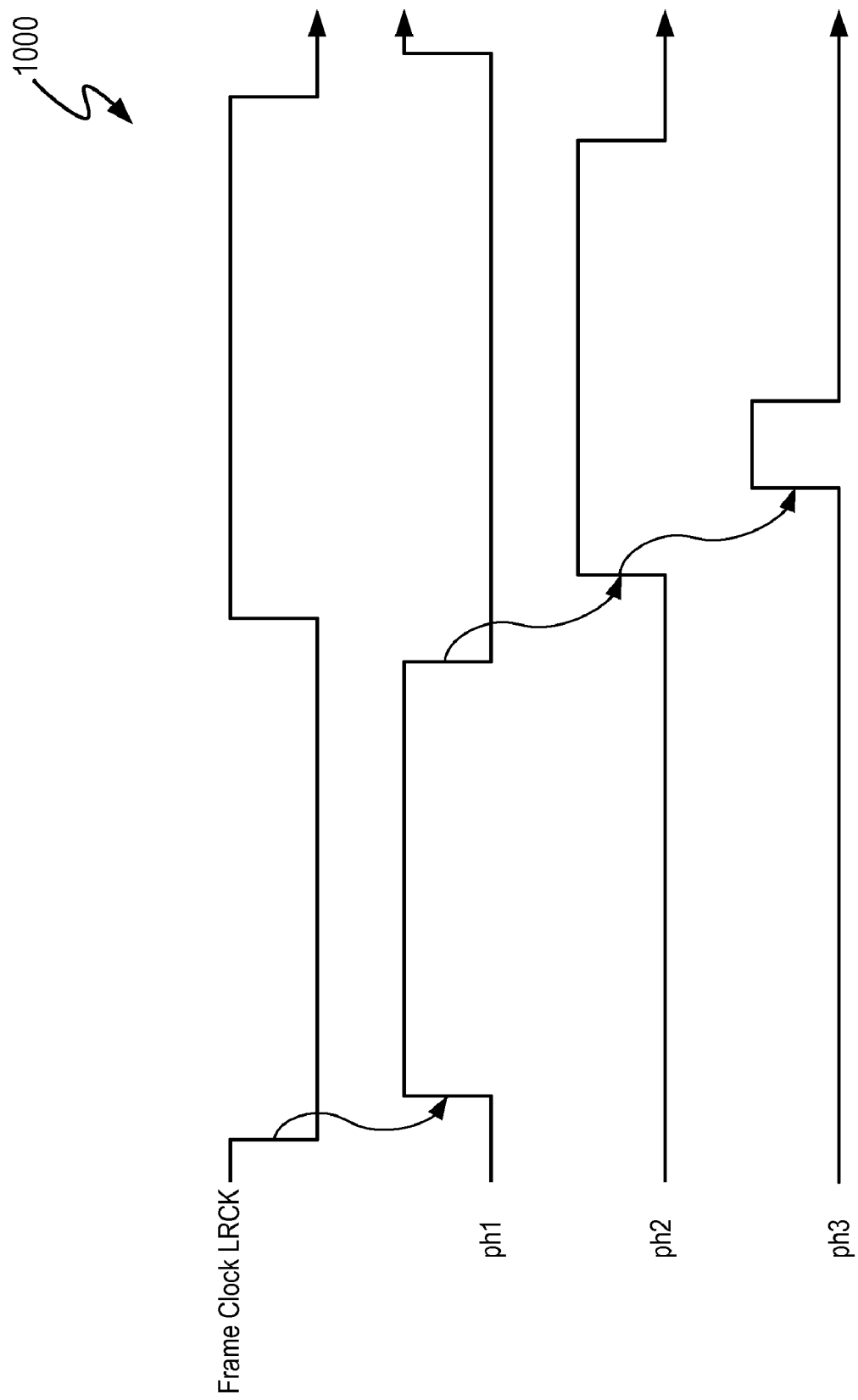
FIG. 10 depicts an operational timing diagram for the phase-locked loop of FIG. 9.

Referring to FIGS. 9 and 10, loop filter 900 includes a single charge pump 902 that responds to an error signal E from phase detector 801 of FIG. 8. In at least one embodiment, charge pump 902 operates and is implemented in the same manner as charge pump 501. Integrator 903 and stabilizer 907 represent respective embodiments of integrator 804 and stabilizer 806 of FIG. 8. Switch control signals "ph1$d$" and "ph2$d$" are slightly delayed versions of respective signals ph1 and ph2 and maintain the same phase relationships with respective signals ph1 and ph2. The signals ph1, ph1$d$, ph2, ph2$d$, and ph3 control the conductivity of switches as depicted in Table 1. In at least one embodiment, when the control signals are "low", the switches are nonconductive, and when the control signals are "high", the switches are conductive.

TABLE 1

| SWITCH | CONTROL SIGNAL |
|---|---|
| 906 | ph1d |
| 908 | ph1 |
| 910 | ph3 |
| 912 | ph2 |
| 914 | ph1d |
| 916 | ph2d |
| 918 | ph1 |
| 920 | ph2 |

When control signals ph3 and ph1$d$ are low and the frame clock signal LRCK is high, the operational-amplifier 905 of sample and reset circuit 904 causes capacitor 909, with value C1, (and node n1) to charge to voltage Vc1. The sample and reset circuit 904 preferably has no memory and, therefore, does not add an extra pole to loop filter 900. The value of voltage Vc1 follows the value of charge pump output current Icp. When the frame clock signal LRCK transitions low, control signals ph1 and ph1$d$ transfer charge from capacitor 909 to cause respective capacitors 911 and 915 to charge to voltage Vc1, with nodes n1=n2=n6=Vc1, n3=0, and n7=0. Capacitors 911 and 915 have respective values C2 and C4. Node n1 is common to both of the feed forward paths of integrator 903 and stabilizer 907. After control signals ph1 and ph1$d$ transition low, control signals ph2 and ph2$d$ transition high to cause respective capacitors 911 and 915 to transfer charge to respective capacitors 913 and 917. Capacitors 913 and 917 have respective values C3 and C5. Capacitors 913 and 917 charge to respective voltages Vc3 and Vc5. Operational-amplifier 922 drives node n4 to 0 so that nodes n2=0, n3=n4=0, n5=Vc3, n6=0, and n7=n8=Vc5. While capacitors 913 and 917 charge, switch 910 conducts, and operational-amplifier 905 resets the voltage of capacitor 909 to 0. "0" is used to indicate a reference voltage. The particular reference voltage is a matter of design choice.

The transconductance amplifiers 924 and 926 convert respective voltages Vc3 and Vc5 into respective currents in accordance with respective transconductance gains gm1 and gm2. The common node n9 effectively sums the two currents to generate the oscillator control signal OCS.

Equation [3] represents the open loop transfer function of phase-locked loop 800:

$$H(s)_{open} = \frac{Kico \times Icp \times \{(C3 \times C4 \times gm2 + C2 \times C5 \times gm1)s + (f \times C2 \times C4 \times gm1)\}}{2\pi \times N \times \{(C1 \times C3 \times C5)s^3 + (C1 \times C3 \times C4)s^2\}}, \quad [3]$$

where Kico is the ICO gain constant, Icp is the charge pump output current, Ci is the value of capacitor Ci for i ∈ {1, 2, 3, 4, 5}, gm1 and gm2 are the respective transconductance gains of transconductance amplifiers 924 and 926, N is the phase-locked loop frequency divider, and f is the reference input clock of the phase-locked loop, which in this embodiment is frame clock signal LRCK. Preferably, the value of the charge pump current Icp does not have wide value swings during operation of loop filter 900. Capacitor 917 provides a smoothing pole for loop filter 900 during switching operations.

Figure 1:
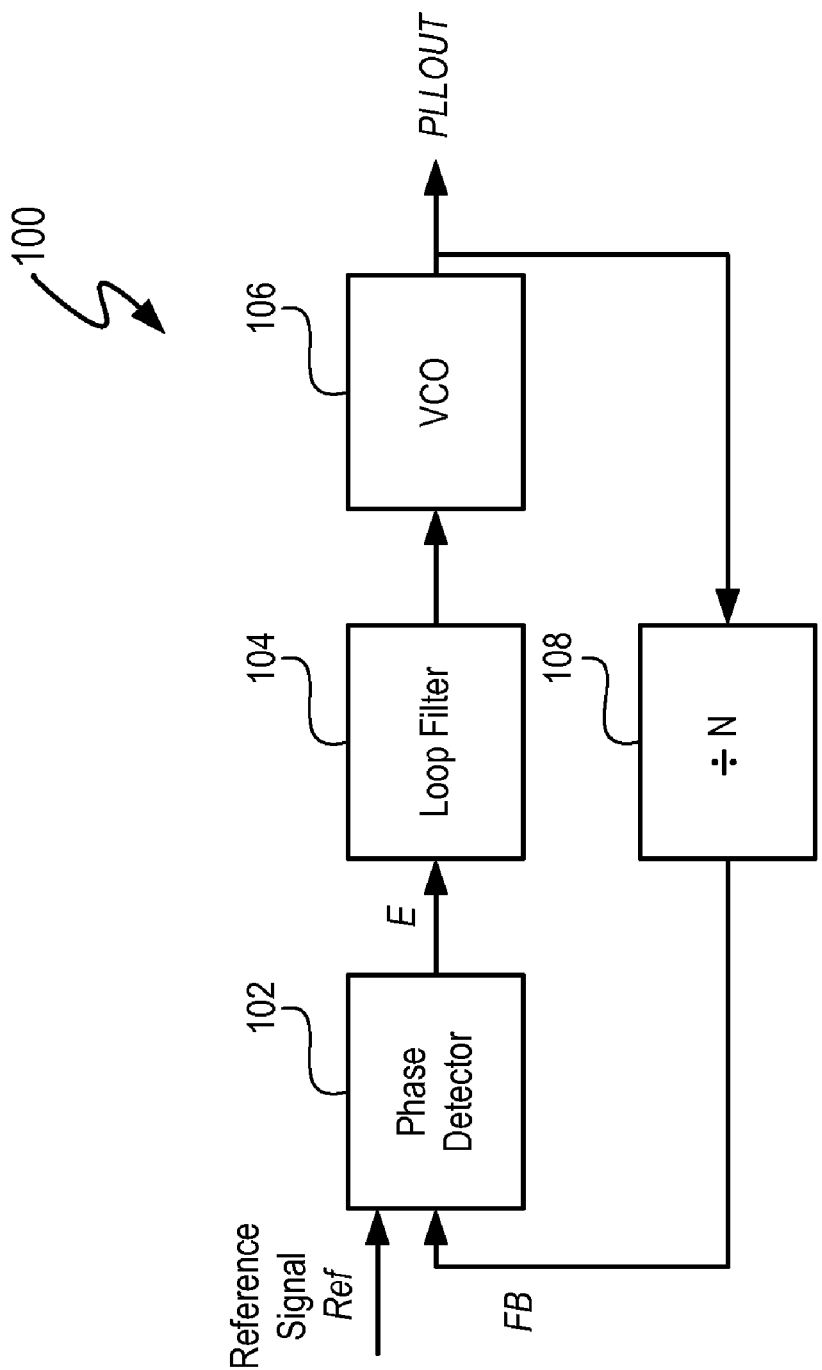
FIG. 1 (labeled prior art) depicts a classical phase-locked loop.
Figure 2:
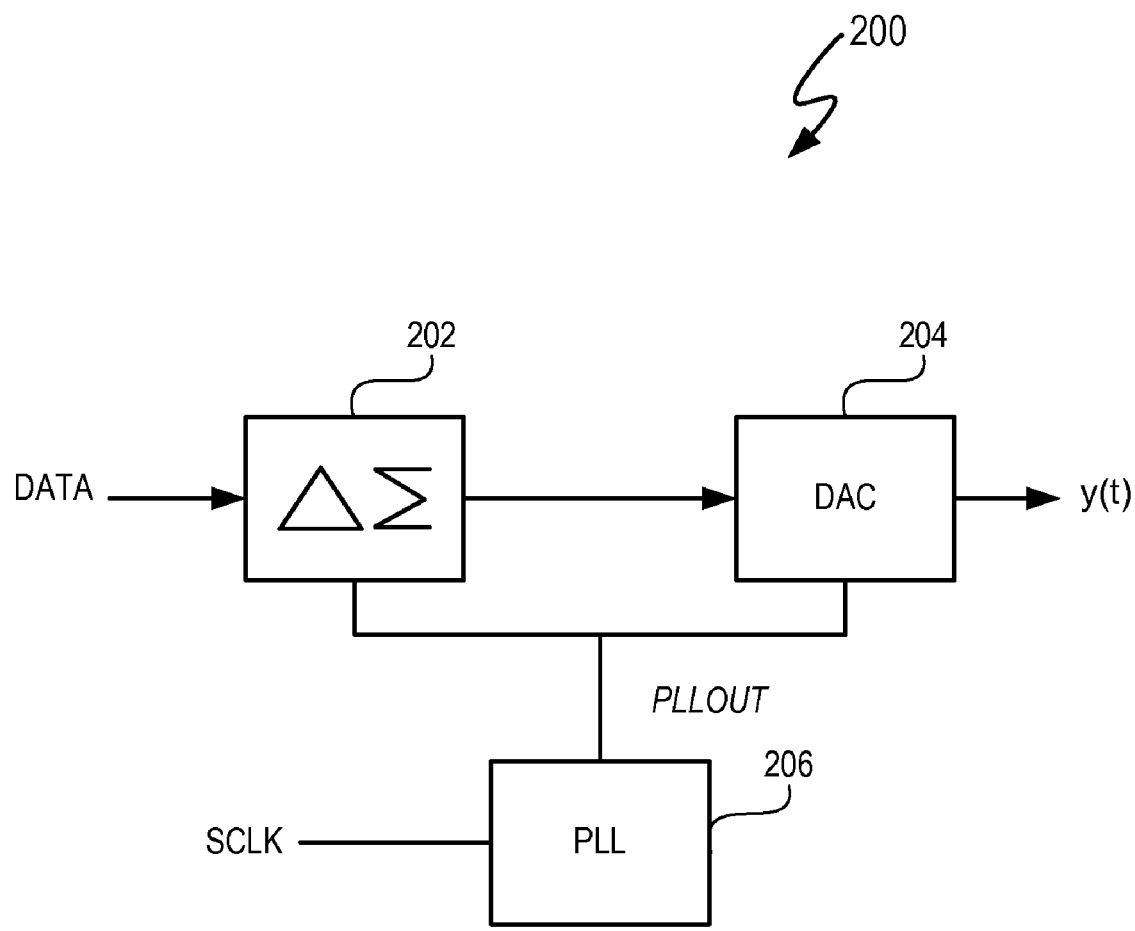
FIG. 2 (labeled prior art) depicts a digital-to-analog signal processing system.
Figure 3:
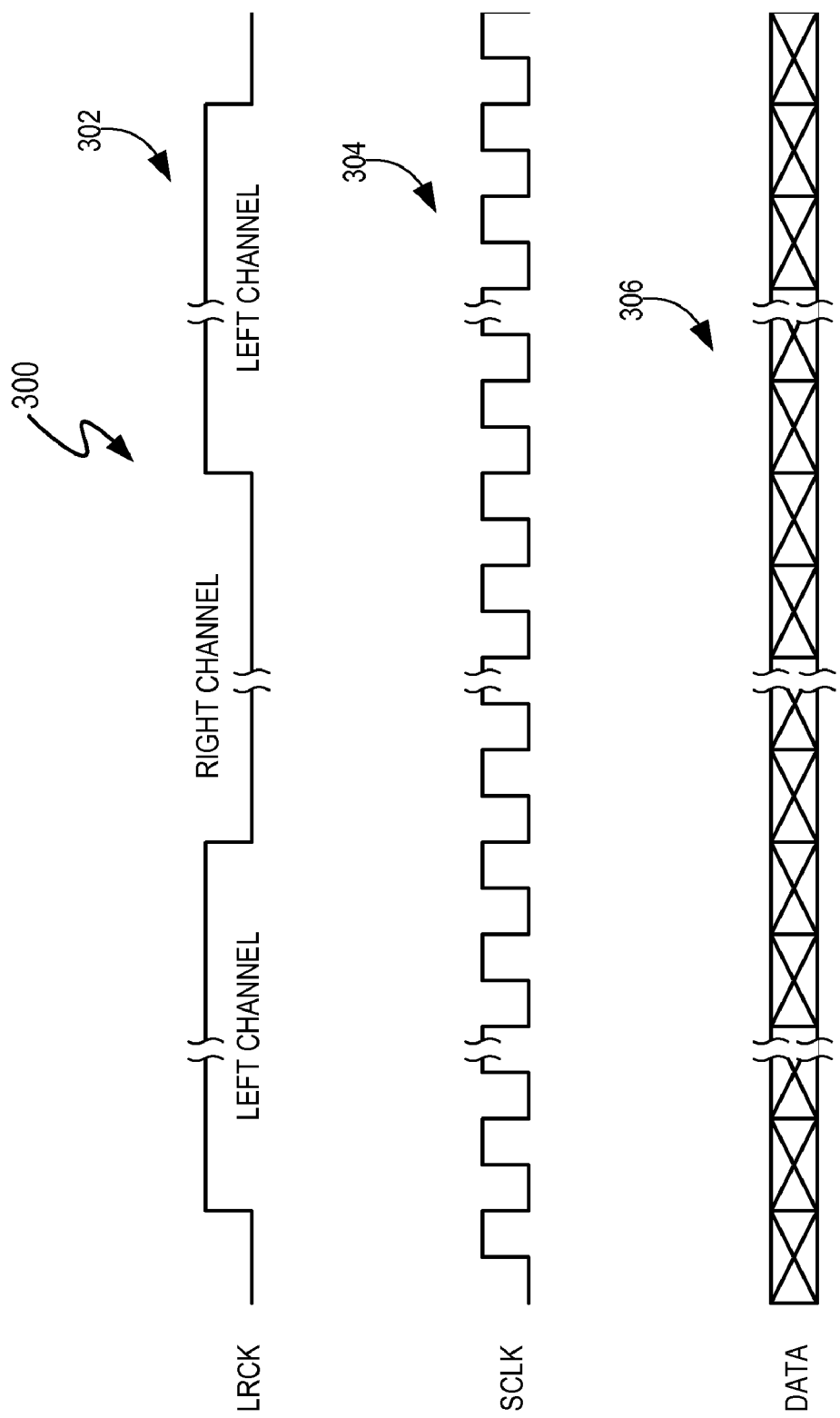
FIG. 3 (labeled prior art) depicts clock signal timing diagrams of two clock signals typically present in an audio digital-to-analog signal processing system.
Figure 4:
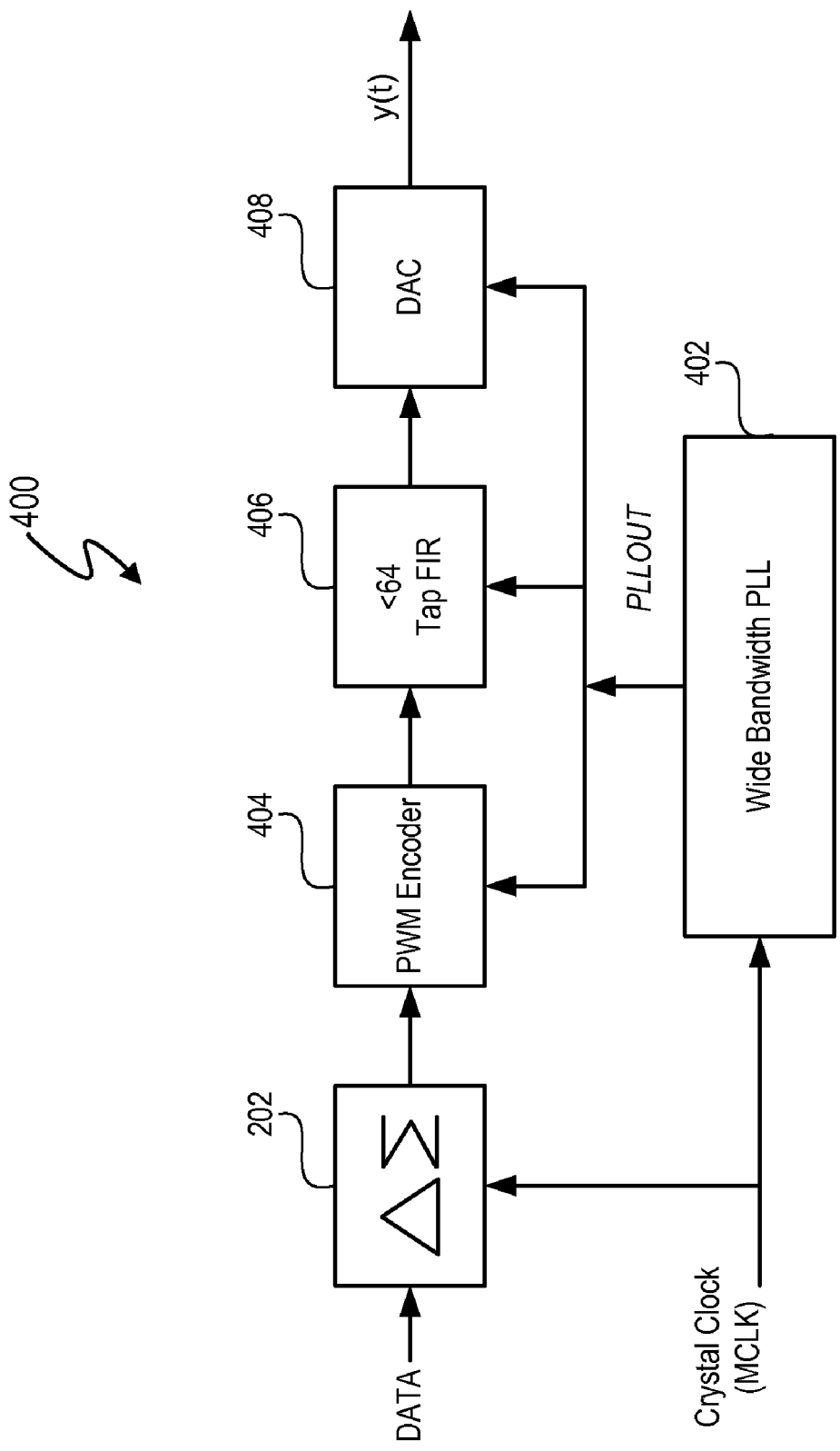
FIG. 4 (labeled prior art) depicts a digital-to-analog signal processing system that uses a master clock MCLK as a reference signal for a wide bandwidth phase-locked loop.
Figure 5:
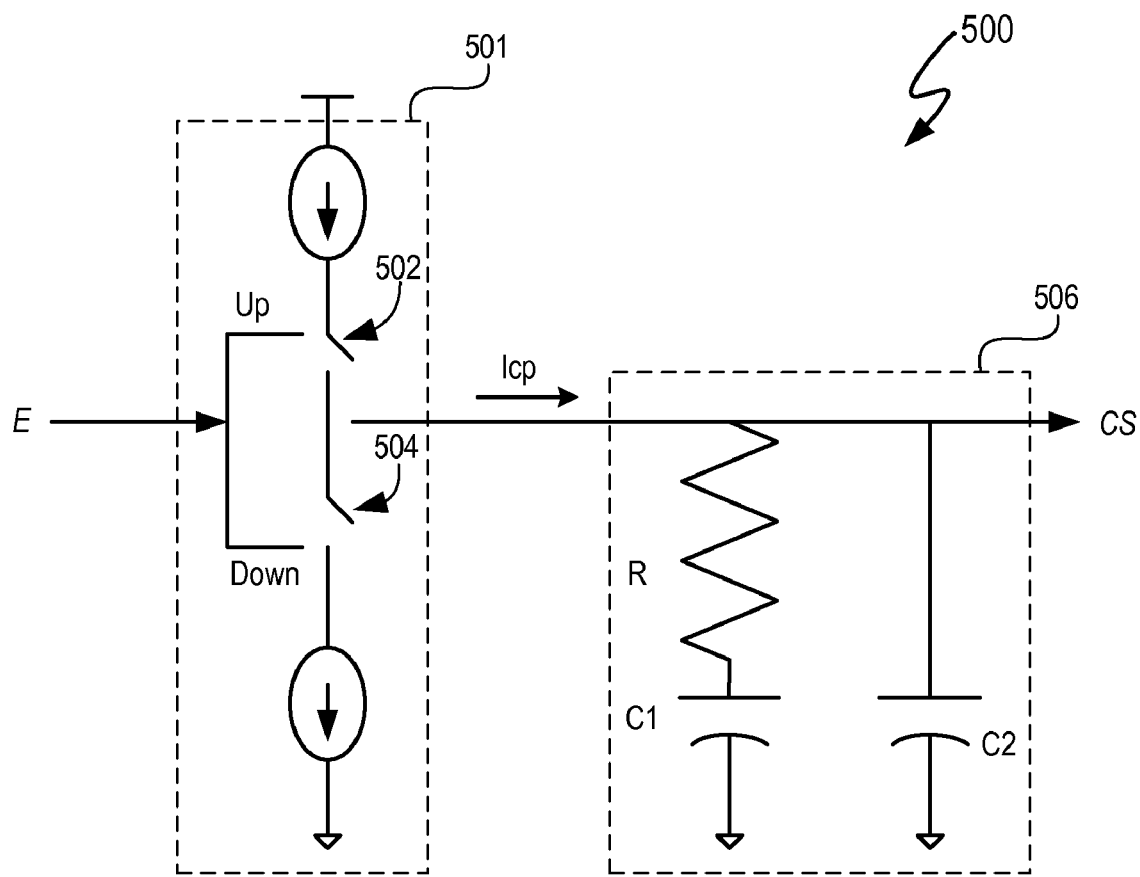
FIG. 5 (labeled prior art) depicts a Type III RC loop filter for a phase-locked loop.
Figure 6:
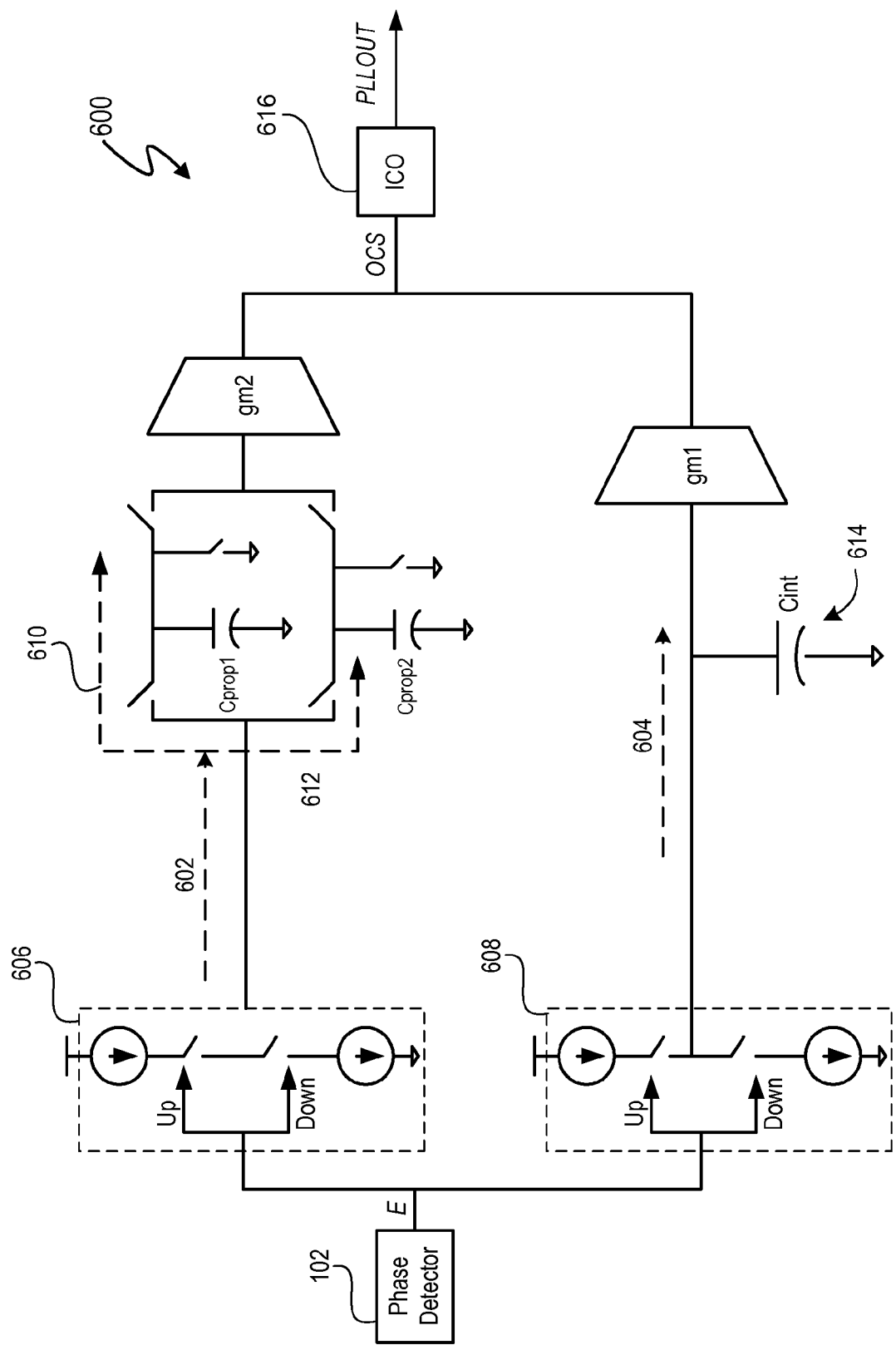
FIG. 6 (labeled prior art) depicts a loop filter for a phase-locked loop.

The bandwidth of loop filter 900 is determined by C1*(C3/C2). Thus, the integrator amplifies the capacitance value C1 of sample and reset circuit 904 by a factor C3/C2. Thus, for a charge pump current of Icp=10 µA, an ICO gain constant Kico×gm1=40 MHz, and for a 5 kHz loop bandwidth, C1=C3=40 pF and C1=1 pF. The total capacitance of 81 pF represents a 12× reduction over comparable, conventional capacitance requirements and can be implemented 'on-chip'. Additionally, loop filter 900 replaces paths 610 and 612 of FIG. 6 with a single path, and thus, component mismatch is no longer an issue.

Thus, in at least one embodiment, a phase-locked loop uses a low bandwidth signal, such as a frame clock, as a reference signal. In a delta sigma modulator/audio system, the frame clock has a low bandwidth relative to the oversampling frequency of the delta sigma modulator. Utilizing the frame clock as the reference signal allows the signal processing system to reduce the number of clock signals present in the signal processing system. In another embodiment, a phase-locked loop includes a loop filter that utilizes a sample and reset circuit, a feed forward integrator, and a feed forward stabilizer to provide a low frequency phase-locked loop bandwidth. In at least one embodiment, the feed forward integrator amplifies capacitance of the sample and reset circuit, which reduces the size of loop filter capacitors and, thus, allows on-chip capacitor integration.

Although the present invention has been described in detail, it should be understood that various changes, substitutions and alterations can be made hereto without departing from the spirit and scope of the invention as defined by the appended claims.

What is claimed is:

1. A signal processing system comprising:
   a phase-locked loop having a reference signal input to receive a reference signal, wherein the reference signal is a frame clock signal having a frequency FS wherein the frame clock signal provides synchronization for one or more blocks of data, the phase-locked loop having components to multiply the reference signal by N to generate a phase-locked loop output signal having a nominal frequency of FS×N, and N is a number greater than one (1);
   a delta sigma modulator having an operating clock input coupled to the phase-locked loop to receive the phase-locked loop output signal; and
   a signal converter coupled to an output of the delta sigma modulator.

2. The signal processing system of claim 1 wherein the signal converter comprises a digital-to-analog converter.

3. The signal processing system of claim 1 wherein the phase-locked loop further comprises:
   a phase detector;
   a loop filter coupled to the phase detector, the loop filter comprising:
      a current source coupled to the phase detector, wherein, during operation, the current source is responsive to a phase detection output signal of the phase detector;
      a feed forward integrator;
      a feed forward stabilizer; and
      a sample and reset circuit coupled between (i) the current source and (ii) the feed forward integrator and the feed forward stabilizer; and
   an oscillator coupled to the feed forward integrator and the feed forward stabilizer and, during operation, the oscillator includes a periodic output signal responsive to output signals of the feed forward integrator and the feed forward stabilizer.

4. The signal processing system of claim 3 wherein the sample and reset circuit further comprises a first capacitor having a value of C1 and the feed forward integrator amplifies C1.

5. The signal processing system of claim 4 wherein the feed forward integrator further comprises a second capacitor and a third capacitor having respective values C2 and C3, wherein the feed forward integrator amplifies C1 by a multiplier comprised of C3/C2.

6. A method of processing a signal, the method comprising:
   phase locking an output signal to a reference signal, wherein the reference signal is a frame clock signal having a frequency FS, the frame clock signal provides synchronization for one or more blocks of data, and the phase-locked loop includes components to multiply the reference signal by N to generate a phase-locked loop output signal having a nominal frequency of FS×N, and N is a number greater than one (1); and
   providing the output signal to an operating clock signal input terminal of a delta sigma modulator.

7. The method of claim 6 wherein phase locking the output signal to the reference signal further comprises:
   detecting a phase difference between the output signal and the reference signal;
   generating a phase correction signal;
   sampling the phase correction signal;
   integrating and stabilizing the phase correction signal using parallel, respective feed forward integration and stabilizing components;
   generating an oscillator control signal from the feed forward integration and stabilizing components; and
   generating a periodic output signal responsive to the oscillator control signal.

8. The method of claim 7 wherein sampling the phase correction signal comprises sampling the phase correction signal using a sample and reset circuit and the sample and reset circuit includes a first capacitor having a value of C1, the method further comprising:
   amplifying the value of C1 using one or more of the feed forward integration components.

9. The method of claim 8 wherein the feed forward integration components further comprise a second capacitor and a third capacitor having respective values C2 and C3 and amplifying the value of C1 using one or more of the feed forward integration components further comprises:
   amplifying C1 by a multiplier comprised of C3/C2.

10. The method of claim 6 further comprising:
    converting an output signal of the delta sigma modulator from a digital signal to an analog signal.

11. A phase-locked loop comprising:
    a phase detector;
    a loop filter coupled to the phase detector, the loop filter comprising:
       a current source coupled to the phase detector, wherein during operation, the current source is responsive to a phase detection output signal of the phase detector;
       a feed forward integrator;
       a feed forward stabilizer; and
       a sample and reset circuit coupled between (i) the current source and (ii) the feed forward integrator and the feed forward stabilizer, wherein the sample and reset circuit includes a first capacitor and the phase-locked loop is configured to amplify capacitance of the first capacitor; and
    an oscillator coupled to the feed forward integrator and the feed forward stabilizer and, during operation, the oscillator includes a periodic output signal responsive to output signals of the feed forward integrator and the feed forward stabilizer.

12. The phase-locked loop of claim 11 wherein the oscillator is a current controlled oscillator.

13. The phase-locked loop of claim 11 wherein the first capacitor of the sample and reset circuit has a value of C1 and the feed forward integrator amplifies C1.

14. The phase-locked loop of claim 13 wherein the loop filter comprises multiple capacitors and all capacitors of the loop filter are integrated on a single integrated circuit chip.

15. The phase-locked loop of claim 13 wherein the feed forward integrator further comprises a second capacitor and a third capacitor having respective values C2 and C3, wherein the feed forward integrator amplifies C1 by a multiplier comprised of C3/C2.

16. The phase-locked loop of claim 11 wherein a bandwidth of the loop filter is less than or equal to 20 kHz.

17. The phase-locked loop of claim 11 further comprising:
    a reference signal input to receive a reference signal, wherein the reference signal is a frame clock signal having a frequency FS wherein the frame clock signal provides synchronization for one or more blocks of data, the phase-locked loop having components to multiply the reference signal by N to generate a phase-locked loop output signal having a nominal frequency of FS×N, and N is a number greater than one (1).

18. A method of phase-locking an output signal to a reference signal, the method comprising:
    detecting a phase difference between the output signal and the reference signal;
    generating a phase correction signal;
    sampling and resetting the phase correction signal, wherein sampling and resetting the phase correction signal comprises sampling the phase correction signal using a sample and reset circuit;
    integrating and stabilizing the sampled phase correction signal using parallel, respective feed forward integration and stabilizing components;
    amplifying a capacitance of the sample and reset circuit;
    generating an oscillator control signal from the feed forward integration and stabilizing components; and
    generating a periodic output signal responsive to the oscillator control signal.

19. The method of claim 18 wherein the sample and reset circuit includes a first capacitor having a value of C1 and amplifying a capacitance of the sample and reset circuit further comprises:
    amplifying the value of C1 using one or more of the feed forward integration components.

20. The method of claim 19 wherein the feed forward integration components comprise a second capacitor and a third capacitor having respective values C2 and C3 and amplifying the value of C1 using one or more of the feed forward integration components further comprises:
    amplifying C1 by a multiplier comprised of C3/C2.

21. The method of claim 18 wherein the reference signal is a frame clock signal having a frequency FS, the frame clock signal provides synchronization for one or more blocks of data, and the phase-locked loop includes components to multiply the reference signal by N to generate a phase-locked loop output signal having a nominal frequency of FS×N, and N is a number greater than one (1).

* * * * *